(12) United States Patent
Mutus et al.

(10) Patent No.: US 10,431,728 B2
(45) Date of Patent: Oct. 1, 2019

(54) SUPERCONDUCTING BUMP BONDS

(71) Applicant: Google LLC, Mountain View, CA (US)

(72) Inventors: Joshua Yousouf Mutus, Santa Barbara, CA (US); Erik Anthony Lucero, Goleta, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/062,064

(22) PCT Filed: Dec. 30, 2015

(86) PCT No.: PCT/US2015/068082
§ 371 (c)(1),
(2) Date: Jun. 13, 2018

(87) PCT Pub. No.: WO2017/105524
PCT Pub. Date: Jun. 22, 2017

(65) Prior Publication Data
US 2018/0366634 A1 Dec. 20, 2018

Related U.S. Application Data

(60) Provisional application No. 62/267,824, filed on Dec. 15, 2015.

(51) Int. Cl.
*H01L 23/498* (2006.01)
*H01L 39/04* (2006.01)
(Continued)

(52) U.S. Cl.
CPC ...... *H01L 39/045* (2013.01); *H01L 23/49816* (2013.01); *H01L 23/49888* (2013.01);
(Continued)

(58) Field of Classification Search
CPC .................................................. H01L 39/045
See application file for complete search history.

(56) References Cited

U.S. PATENT DOCUMENTS 6,216,941 B1 * 4/2001 Yokoyama ............. H01L 24/11
228/121
7,075,171 B2 7/2006 Hato
(Continued)

FOREIGN PATENT DOCUMENTS

WO 2017079417 5/2017

OTHER PUBLICATIONS

Yorozu et al, "Sub-Kelvin single flux quantum control circuits and multi-chip packaging for supporting superconducting qubit", Journal of Physics: Conference Series, vol. 43, No. 1, 2006, pp. 1417-1420.
(Continued)

*Primary Examiner* — Eugene Lee
(74) *Attorney, Agent, or Firm* — Fish & Richardson P.C.

(57) ABSTRACT

A device (100) includes a first chip (104) having a first circuit element (112), a first interconnect pad (116) in electrical contact (118) with the first circuit element, and a barrier layer (120) on the first interconnect pad, a superconducting bump bond (106) on the barrier layer, and a second chip (102) joined to the first chip by the superconducting bump bond, the second chip having a quantum circuit element (108), in which the superconducting bump bond provides an electrical connection between the first circuit element and the quantum circuit element.

14 Claims, 5 Drawing Sheets

(51) Int. Cl.
    *H01L 23/00*       (2006.01)
    *H01L 25/065*      (2006.01)
    *H01L 27/18*       (2006.01)
    *H01L 25/00*       (2006.01)
    *H01L 25/18*       (2006.01)

(52) U.S. Cl.
    CPC .............. *H01L 24/03* (2013.01); *H01L 24/05* (2013.01); *H01L 24/10* (2013.01); *H01L 24/11* (2013.01); *H01L 24/13* (2013.01); *H01L 24/16* (2013.01); *H01L 24/81* (2013.01); *H01L 25/0657* (2013.01); *H01L 25/18* (2013.01); *H01L 25/50* (2013.01); *H01L 27/18* (2013.01); *H01L 2224/0345* (2013.01); *H01L 2224/0362* (2013.01); *H01L 2224/0381* (2013.01); *H01L 2224/0384* (2013.01); *H01L 2224/03826* (2013.01); *H01L 2224/0401* (2013.01); *H01L 2224/05023* (2013.01); *H01L 2224/05025* (2013.01); *H01L 2224/05124* (2013.01); *H01L 2224/05179* (2013.01); *H01L 2224/05186* (2013.01); *H01L 2224/05564* (2013.01); *H01L 2224/05568* (2013.01); *H01L 2224/05669* (2013.01); *H01L 2224/05684* (2013.01); *H01L 2224/05686* (2013.01); *H01L 2224/1145* (2013.01); *H01L 2224/1181* (2013.01); *H01L 2224/13023* (2013.01); *H01L 2224/13109* (2013.01); *H01L 2224/13116* (2013.01); *H01L 2224/13164* (2013.01); *H01L 2224/13179* (2013.01); *H01L 2224/13183* (2013.01); *H01L 2224/16145* (2013.01); *H01L 2224/81013* (2013.01); *H01L 2224/81193* (2013.01); *H01L 2224/81201* (2013.01); *H01L 2224/81409* (2013.01); *H01L 2225/06513* (2013.01); *H01L 2225/06541* (2013.01); *H01L 2924/10253* (2013.01); *H01L 2924/10271* (2013.01); *H01L 2924/10329* (2013.01); *H01L 2924/20102* (2013.01)

(56) References Cited

U.S. PATENT DOCUMENTS

| | | | |
|---|---|---|---|
| 7,180,077 B1* | 2/2007 | Farhoomand | H01L 27/14603 250/338.4 |
| 7,932,515 B2 | 4/2011 | Bunyk | |
| 2010/0041558 A1* | 2/2010 | Aliane | G01T 1/1606 505/160 |
| 2017/0133336 A1* | 5/2017 | Oliver | H01L 24/05 |
| 2018/0012932 A1* | 1/2018 | Oliver | H01L 24/05 |
| 2018/0247974 A1* | 8/2018 | Oliver | H01L 39/223 |

OTHER PUBLICATIONS

Huang et al, "Electroplated indium bump arrays and the bonding reliability", Journal of Semiconductors, vol. 31, No. 11, 116004, Nov. 2010.
Weber et al, "Single crystal silicon capacitors with low microwave loss in the single photon regime," Quantum Nanoelectronics Laboratory, Apr. 21, 2011, 3 pages.
International Search Report for International Application No. PCT/US2015/068082, dated Aug. 23, 2016.
AU Office Action issued in Australian Application No. 2015417766, dated Jan. 24, 2019, 2 pages.
CA Office Action issued in Canadian Application No. 3008825, dated Mar. 11, 2019, 3 pages.

* cited by examiner

SUPERCONDUCTING BUMP BONDS

CROSS-REFERENCE TO RELATED APPLICATIONS

This application claims priority to and is a U.S. National Phase under 371 of International Application No. PCT/US2015/068082, filed on Dec. 30, 2015, which claims the benefit of U.S. Provisional Ser. No. 62/267,824, filed on Dec. 15, 2015, and are incorporated by reference in their entirety.

TECHNICAL FIELD

The present disclosure relates to superconducting bump bonds.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle+\beta|0\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the present disclosure relates to one or more devices that include: a first chip including a first circuit element, a first interconnect pad in electrical contact with the first circuit element, and a barrier layer on the first interconnect pad; a superconducting bump bond on the barrier layer; and a second chip joined to the first chip by the superconducting bump bond, the second chip including a first quantum circuit element, in which the superconducting bump bond provides an electrical connection between the first circuit element and the first quantum circuit element.

Implementations of the devices can include one or more of the following features. For example, in some implementations, the first interconnect pad includes aluminum.

In some implementations, the barrier layer includes titanium nitride.

In some implementations, the superconducting bump bond includes indium.

In some implementations, the first circuit element includes a rapid single flux quantum (RSFQ) device.

In some implementations, the first circuit element includes a second quantum circuit element.

In some implementations, at least one of the first chip and the second chip includes a silicon substrate.

In some implementations, at least one of the first chip and the second chip includes a sapphire substrate.

In some implementations, a first surface of the first chip is spaced apart from and faces a first surface of the second chip to form a gap, and a thickness of the gap between the first surface of the first chip and the first surface of the second chip is between about 5 microns to about 10 microns.

In some implementations, a first surface of the first chip is spaced apart from and faces a first surface of the second chip to form a gap, and a thickness of the gap between the first surface of the first chip and the first surface of the second chip is about 1 micron.

In another aspect, the subject matter of the present disclosure can be embodied in methods that include: providing a first chip including a first circuit element; forming a first aluminum interconnect pad on a first surface of the first chip so that the first aluminum interconnect pad is electrically connected to the first circuit element; forming a first titanium nitride barrier layer on the first aluminum interconnect pad; providing a second chip including a second circuit element; forming an indium bump bond; and bonding the first chip to the second chip with the indium bump bond so that the first circuit element is electrically connected to the second circuit element, in which bonding the first chip to the second chip is performed at room temperature.

Implementations of the methods can include one or more of the following features. For example, in some implementations, room temperature is between approximately 18° C. and approximately 30° C.

In some implementations, the methods further include removing a native oxide from the first aluminum interconnect pad prior to forming the first titanium nitride barrier layer. Removing the native oxide can include ion milling a surface of the first aluminum interconnect pad.

In some implementations, forming the first titanium nitride barrier includes reactive sputtering titanium nitride on the first aluminum interconnect pad. In some implementations, the methods further include ion milling a surface of the first titanium nitride barrier layer prior to bonding the first chip to the second chip.

In some implementations, the methods further include exposing a surface of the indium bump bond to a $H_2$ plasma.

In some implementations, the methods further include: forming a second aluminum interconnect pad on a first surface of the second chip so that the second aluminum interconnect pad is electrically connected to the second circuit element; and forming a second titanium nitride barrier layer on the second aluminum interconnect pad of the second chip. The methods can further include removing a native oxide from the second aluminum interconnect pad of the second chip prior to forming the second titanium nitride barrier layer. Removing the native oxide from the second aluminum interconnect pad can include ion milling a surface of the second aluminum interconnect pad.

In some implementations, forming the second titanium nitride barrier layer on the second aluminum interconnect pad includes reactive sputtering titanium nitride on the second aluminum interconnect pad.

In some implementations, the methods further include ion milling a surface of the second titanium nitride barrier layer prior to bonding the first chip to the second chip.

In some implementations, forming the indium bump bond includes depositing indium on the first titanium nitride barrier, on the second titanium nitride barrier, or on both the first and second titanium nitride barriers.

In some implementations, the first circuit element includes a rapid single flux quantum (RSFQ) device and the second circuit element includes a quantum circuit element.

In some implementations, the first circuit element includes a first quantum circuit element and the second circuit element includes a second quantum circuit element.

In general, in another aspect, the subject matter of the present disclosure encompasses methods that include: providing a first chip comprising a first circuit element; forming an interconnect pad on the first chip so that the interconnect pad is electrically connected to the first circuit element; forming a barrier layer on the interconnect pad; providing a second chip including a quantum circuit element; forming a superconducting bump bond; and bonding the first chip to the second chip with the superconducting bump bond so that the first circuit element is electrically connected to the quantum circuit element through the superconducting bump bond.

Implementations of the methods can include one or more of the following features. For example, in some implementations, forming the superconducting bump bond includes depositing a superconductor material on the barrier layer of the first chip, on the second chip, or on both the barrier layer of the first chip and on the second chip.

In general, in another aspect, the subject matter of the present disclosure can be embodied in one or more methods of operating a device having a first chip including a first circuit element connected, through a superconducting bump bond, to a second chip including a first quantum circuit element, in which the one or more methods include: transferring data between the second chip and the first chip through the superconducting bump bond. The first chip can further include a first interconnect pad in electrical contact with the first circuit element, and a barrier layer on the first interconnect pad, where the superconducting bump bond is arranged on the barrier layer to provide an electrical connection between the first circuit element and the first quantum circuit element.

Implementations of the methods can include one or more of the following features. For example, in some implementations, the methods can further include operating the first quantum circuit element to produce the data, in which transferring the data includes transferring the data from the first quantum circuit element of the second chip to the first circuit element of the first chip. In some implementations, the methods further include operating the first circuit element to produce the data, in which transferring the data includes transferring the data from the first circuit element of the first chip to the first quantum circuit element of the second chip.

Various embodiments and implementations can include one or more of the following advantages. For example, in some implementations, the devices and methods allow an increase in qubit density and/or qubit coupling through 3D integration. Furthermore, the devices and methods, in some implementations, allow the 3D integration to be achieved while reducing losses associated with processing methods and materials.

The details of one or more embodiments of the invention are set forth in the accompanying drawings and the description below. Other features, objects, and advantages of the invention will be apparent from the description and drawings, and from the claims.

DETAILED DESCRIPTION

Quantum computing entails coherently processing quantum information stored in the qubits of a quantum computer. In certain types of quantum computing processors, such as quantum annealers, the qubits of the quantum processor are coupled together in a controllable manner such that the quantum state of each qubit affects the corresponding quantum states of the other qubits to which it is coupled. Depending on the processor design, the chosen architecture may limit the density and total number of qubits available for coupling, and thus limit the ability of the processor to perform complex problems requiring large numbers of qubits. Furthermore, in certain quantum computing designs, the qubits may suffer energy loss and decoherence due to interactions with two level systems. For instance, in quantum computers that use qubits formed from superconductor materials, the presence of lossy non-superconducting materials from, e.g., classical circuit elements with which the quantum computers communicate, and from the connections between the classical circuit elements and the quantum circuit elements can lead to increased decoherence. To increase qubit density and expand the number of qubits available for coupling in a quantum processor, such as a quantum annealer having superconducting quantum circuit elements, the processor and associated circuit elements can be constructed using 3D integration. That is, instead of fabricating the quantum circuit elements of the processor within a single plane of a chip that extends along one and/or two dimensions (e.g., x- and/or y-directions), the quantum circuit elements can also be formed in multiple chips that are coupled together along a third dimension (e.g., z-direction). An approach for achieving 3D integration, without introducing lossy processing/dielectrics, is to couple the chips using bump bonding, in which the chips are joined to one another by superconducting bump bonds. Similarly, in some implementations, chips having classical circuit elements can also be coupled to chips including quantum circuit elements using 3D integration and superconducting bump bonds. By using superconducting bump bonds for coupling, it is possible to achieve a reduction in the energy loss and decoherence that can otherwise occur with lossy non-superconducting materials. Furthermore, to avoid the formation of alloys between the superconducting bump bond and any underlying interconnection pads on a chip, barrier layers are provided to prevent diffusion of materials from the bump bonds to the interconnection pads and vice versa.

Figure 1:
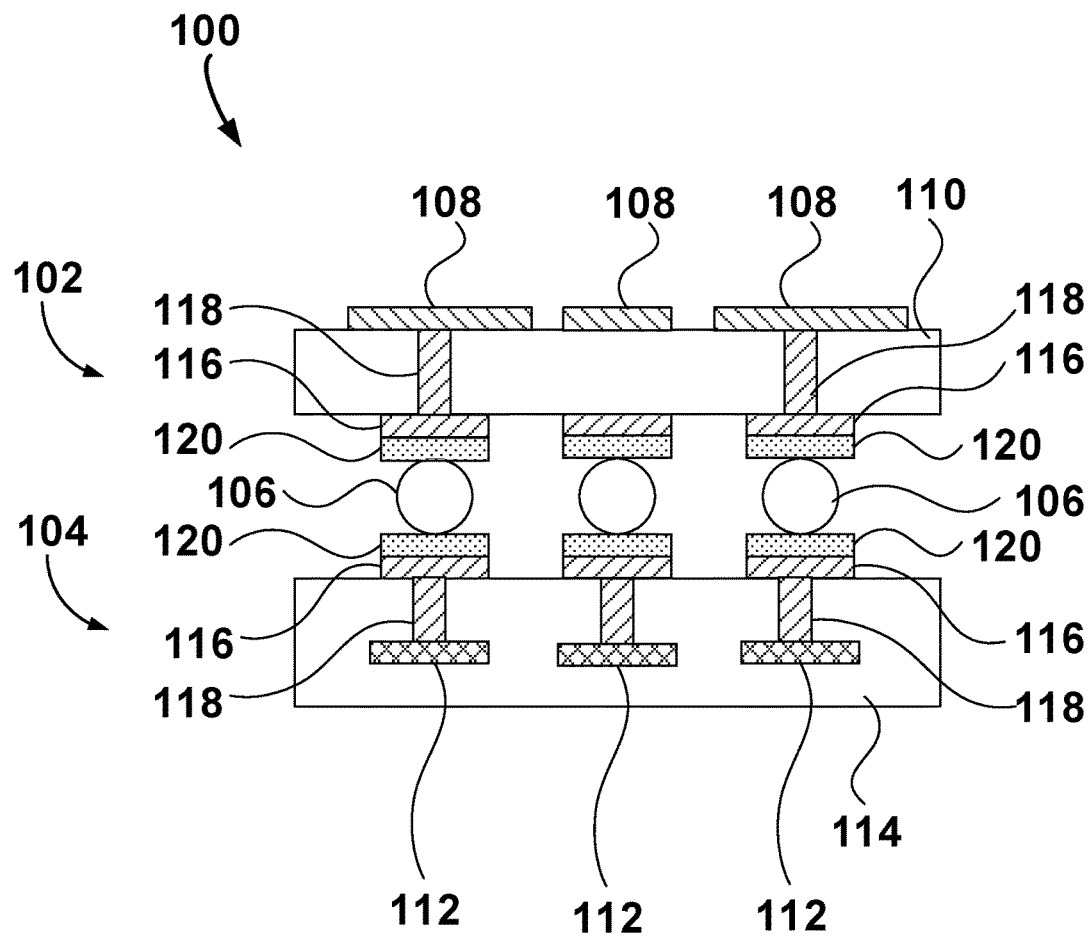
FIG. 1 is a schematic illustrating an example of a device that includes a first chip bonded to a second chip by one or more superconducting bump bonds.

FIG. 1 is a schematic illustrating an example of a device 100 that includes a first chip 102 that is joined (e.g., bonded) to a second chip 104 by one or more superconducting bump bonds 106. Each chip can include one or more circuit elements for performing data processing operations. For example, the first chip 102 can include one or more first circuit elements 108 formed on a substrate 110. The first circuit elements 108 can include, e.g., quantum circuit elements for use in performing quantum processing operations. That is, the quantum circuit elements can be configured to make use of quantum-mechanical phenomena, such as superposition and entanglement, to perform operations on data in a non-deterministic manner. Certain quantum circuit elements, such as qubits, can be configured to represent and operate on information in more than one state simultaneously. In some implementations, quantum circuit elements include circuit elements formed in part from superconducting materials such as, for example, superconducting coplanar waveguides, quantum LC oscillators, flux qubits, superconducting quantum interference devices (SQUIDS) (e.g., RF-SQUID or DC-SQUID), among others. A superconductor material includes a material that exhibits superconducting properties at or below a corresponding superconducting critical temperature, such as aluminum (e.g., superconducting critical temperature of 1.2 Kelvin) or niobium (e.g., superconducting critical temperature of 9.3 Kelvin). The circuit elements 108 can, depending on element type and design, be formed of one or more layers of material such as, e.g., superconducting materials and dielectrics. To reduce energy loss and decoherence, the substrate 110 for quantum circuit elements can be formed from a low loss dielectric material, such as single crystalline silicon or sapphire.

The second chip 104 includes one or more second circuit elements 112 formed on or within substrate 114. The second circuit elements 112 also can include quantum circuit elements as described herein. Similarly, the substrate 114 can be formed from a low loss dielectric material suitable for quantum circuit elements, such as single crystalline silicon or sapphire. Alternatively, the second circuit elements 112 include classical circuit elements. Classical circuit elements generally process data in a deterministic manner and include, e.g., circuit elements such as rapid single flux quantum (RSFQ) devices. RSFQ is a digital electronics technology that uses superconducting devices, namely Josephson junctions, to process digital signals. In RSFQ logic, information is stored in the form of magnetic flux quanta and transferred in the form of Single Flux Quantum (SFQ) voltage pulses. Josephson junctions are the active elements for RSFQ electronics, just as transistors are the active elements for semiconductor electronics. RSFQ is one family of superconducting or SFQ logic. Others include, e.g., Reciprocal Quantum Logic (RQL) and ERSFQ, which is an energy-efficient version of RSFQ that does not use bias resistors. Other examples of classical circuit elements include digital or analog complementary metal oxide semiconductor (CMOS) devices. Data manipulated by digital circuit elements typically are represented in either one of two different states, e.g., a 0 or 1. The classical circuit elements 112 may be configured to collectively carry out instructions of a computer program by performing basic arithmetical, logical, and input/output operations on data, in which the data is represented in analog or digital form. In some implementations, classical circuit elements 112 of the second chip 104 can be used to transmit data to and receive data from the quantum circuit elements fabricated on the first chip 102 through electrical connections established by the superconducting bump bonds 106. Though shown in FIG. 1 as single components, the classical circuit elements 112 can be constructed using layers of different materials (e.g., semiconductors, dielectrics and metals) as is known in standard CMOS fabrication. An advantage to using these fabrication methods is that they allow wiring to be routed in relatively complex 3D geometries, enabling greater numbers of connections among the qubits in chip 102 and through the bonds 106. The substrate 114 can be formed from materials such as single crystal silicon, silicon germanium, or gallium arsenide, among others.

Classical circuit elements generally are not formed on or within the same chip as the quantum circuit elements. This is because, at least in some implementations, the dielectrics (e.g., $SiO_2$) and/or non-superconducting metals used to fabricate classical circuit elements tend to be sources of energy loss and decoherence, such that they interfere with the quantum circuit elements and render operation of the quantum processor inefficient and unreliable. By coupling the second chip 104 to the first chip 102 with superconducting bump bonds 106, however, it is possible to reduce the decoherence effects of the classical circuit elements and/or materials on the quantum circuit elements. Suitable superconducting materials for use as a superconducting bump bond 106 include indium, lead, rhenium, palladium, or niobium having a thin gold layer, among others.

In general, bump bonds are formed on interconnect pads 116 that provide an electrical connection to the circuit elements of chip 102 and to the circuit elements of chip 104. For example, in some implementations, the interconnect pads 116 of the first chip 102 are electrically connected to one or more of the first circuit elements 108 through interconnects 118 formed on and/or within the substrate 110. The interconnect pads 116 of the second chip 104 are electrically connected to one or more of the second circuit elements 112 through interconnects 118 formed on and/or within the substrate 114. Though interconnects 118 and circuit elements 112 are shown as extending through the substrate 110, the interconnects 118 and circuit elements 112 can instead be formed as part of a single layer of metallization on the substrate surface (e.g., co-planar with pads 116). When the interconnect pads 116 are arranged on a chip containing quantum circuit elements, the pads 116 can be formed from a superconducting material to reduce decoherence and energy loss. Similarly, the pads 116 and interconnects 118 on chip 104 can be formed from a superconducting material to reduce the heat generated from chip 104. For instance, the interconnect pads 116 and interconnects 118 on chip 102 can be formed of aluminum, which is a superconducting metal used for fabricating quantum circuit elements. Other superconducting materials that can be used for pads 116 and interconnects 118 include, e.g., niobium or titanium nitride. The interconnects 118 and pads 116 of the second chip 104 also may be formed from superconducting materials, such as aluminum, niobium or titanium nitride, or, in some implementations, non-superconducting electrically conductive materials.

When indium and aluminum are placed in contact with one another, however, diffusion between indium and aluminum leads to the formation of a non-superconducting alloy that increases decoherence effects. Inter-diffusion of indium and aluminum can also lead to mechanical failures of the devices and problems, such as voiding and pitting. To avoid the formation of alloys between the superconducting bump bond 106 and the interconnecting pads 116, a barrier layer 120 is arranged between the superconducting bump bonds 106 and the interconnecting pads 116. The barrier layer 120 includes a superconducting material that also serves as an electrically conducting barrier that blocks diffusion of the bump bond material into the interconnecting pad 116 and/or vice-versa.

Figure 2:
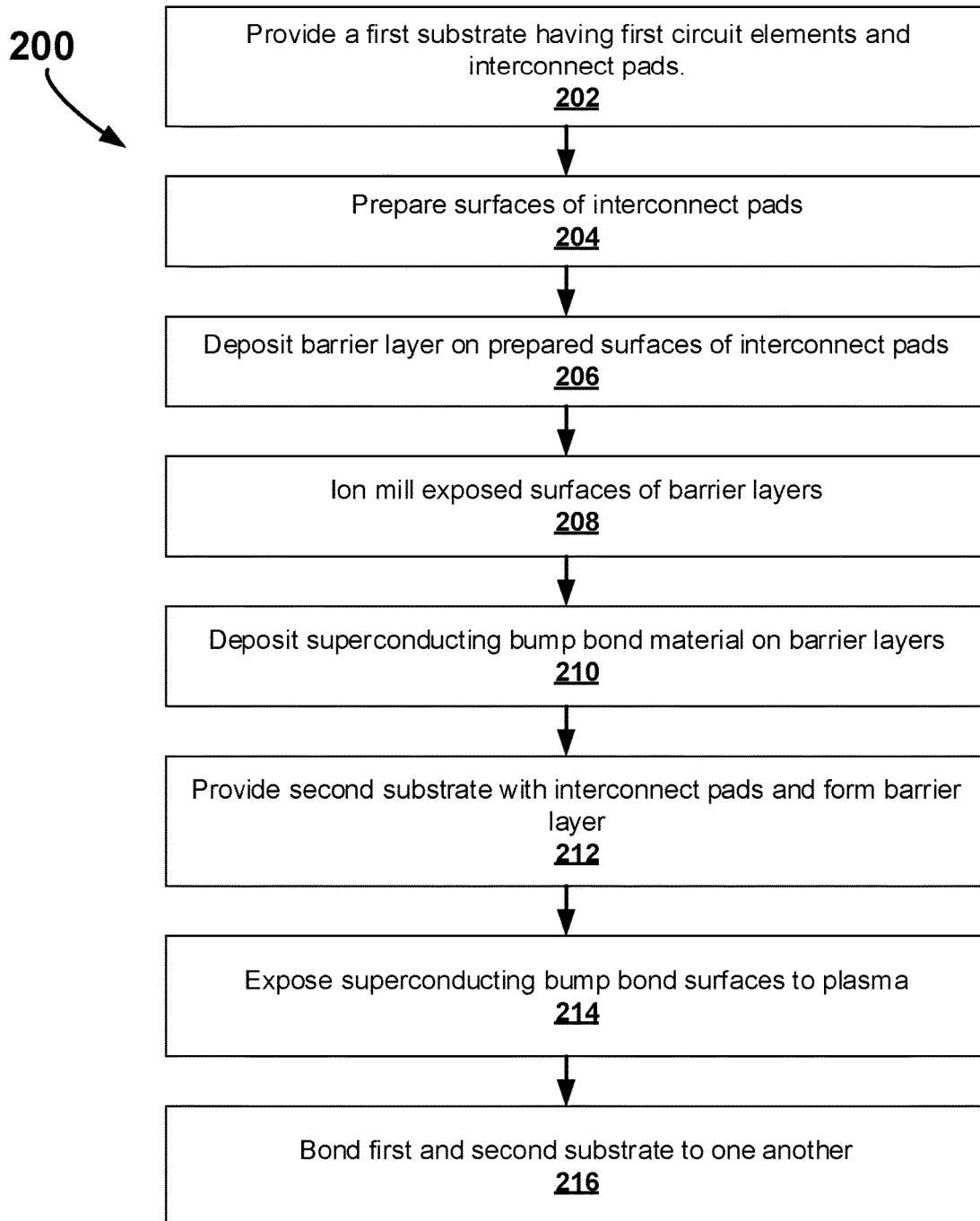
FIG. 2 is a flow chart that illustrates an example process for bonding a first chip to a second chip with superconducting bump bonds to form a device.

FIG. 2 is a flow chart that illustrates an example process 200 for joining a first chip to a second chip with superconducting bump bonds to form a device, such as device 100 shown in FIG. 1. FIGS. 3A-3E are schematics that illustrate the fabrication process set forth in FIG. 2. The views shown in FIGS. 3A-3E correspond to side views of the fabrication process, in which layers extend into and out of the page.

The size of the layers shown in the figures is not intended to be to scale.

Figure 3A:
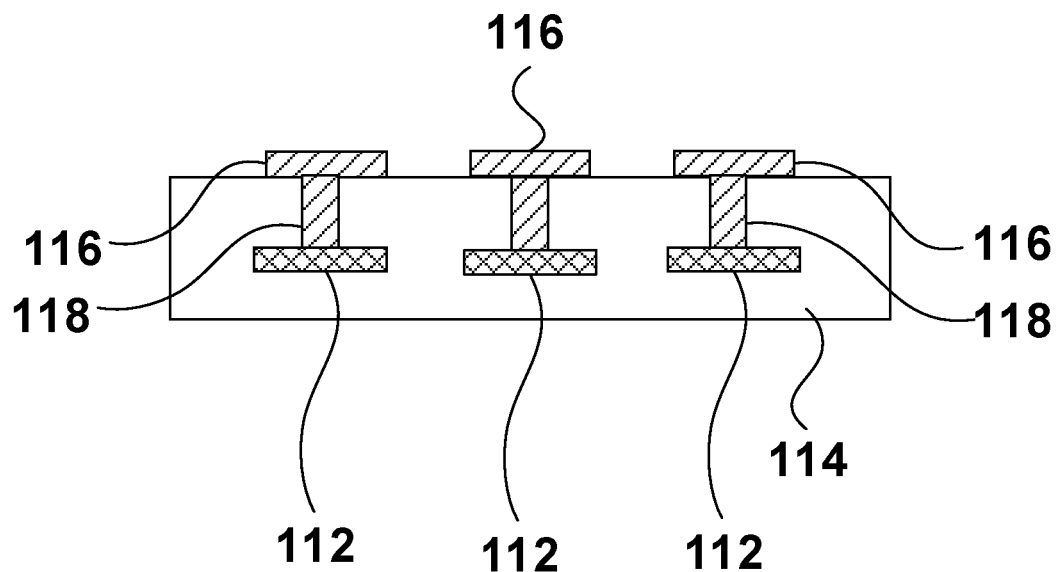
FIGS. 3A-3E are schematics that illustrate the fabrication process set forth in FIG. 2.

In process 200, a first substrate 114 is provided (202). FIG. 3A is a schematic illustrating an example of the first substrate 114. The first substrate 114 can include, for example, a single crystalline silicon wafer in which one or more circuit elements 112 are formed. Alternatively, the substrate 114 and circuit elements 112 can correspond to a die obtained from a wafer that has been diced. As explained herein, the circuit elements 112 can include quantum circuit elements or classical circuit elements. For the present example, it is assumed that the circuit elements 112 are classical circuit elements and the substrate 114 is a single crystalline silicon substrate. The circuit elements 112 can be electrically connected to one or more interconnect pads 116 through interconnects 118. The interconnects 118 can be formed, e.g., from a superconducting material or other electrically conductive material through a combination of photolithography to define openings within the substrate 114, as well as deposition and removal techniques, such as vapor deposition and wet or dry etching, to fill the opening with the interconnect material. Though shown being formed in the body of the substrate 114, the interconnects 118 can be formed on a surface of the substrate 114 instead. The interconnect pads 116 can be formed, e.g., from aluminum or another material that is superconducting. The interconnect pads 116 can also be deposited and defined using a combination of photolithography, and standard deposition and wet or dry etching techniques.

Next, the surfaces of the interconnect pads 116 are prepared (204). In some implementations, the metal interconnect pads, have a thin native oxide layer on their surface. For instance, aluminum can have a layer of $AlO_x$. The thin native oxide layer is insulating, reducing the electrical conductivity of the connection to the superconducting bump bond. To remove the native oxide, the surface of the interconnect pad 116 is exposed to an ion milling process. Ion milling includes delivering ions (e.g., Ar ions) to the surface of the interconnect pads 116 from an angle, such that material is sputtered from the surface. Typically, the ion milling process is performed under vacuum conditions. For instance, the ion milling can be performed under a vacuum pressure of 3 mTorr and temperature of about 28° C.

Figure 3B:
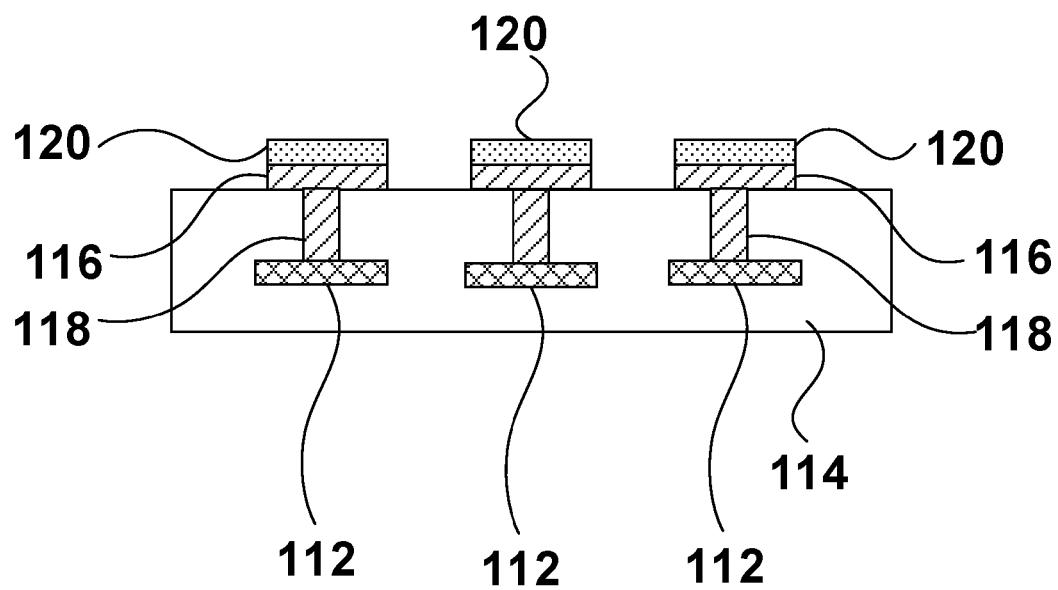

Once the native oxide is removed, a barrier layer 120 is deposited on the prepared surfaces of the interconnect pads 116 (206). The barrier layer includes a material that blocks diffusion of the bump bond material into the interconnect pad 116 and/or vice-versa, but also retains superconductivity. The barrier layer also preferably does not form an alloy itself with either the interconnect pad 116 or the superconducting bump bond to be formed. To reduce decoherence that might be induced in nearby quantum circuit elements by the barrier layer, the barrier layer material may be formed from a superconductor material. For example, the barrier layer material can be formed from titanium nitride (having a superconducting critical temperature of about 4.2 K). Alternatively, the barrier layer material can include a metal that becomes superconducting via the proximity effect, such as platinum or tungsten. Deposition of the barrier layer can include, e.g., performing reactive sputtering. Reactive Sputtering is a process where a target of one chemical composition is sputtered in the presence of a gas or a mixture of gasses (e.g., Ar ions or $N_2$) that will react with the target material to form a coating of a different chemical composition. Argon is in most cases the main gas and the amount of a reactive gas introduced into a process chamber is controlled to produce a fully reacted compound. As an example, reactive sputtering can be performed using a mixture of Ar and $N_2$ under a base pressure of about $2*10^{-8}$ Torr and a background pressure of about 3 mTorr and temperature of about 28° C. After deposition of the barrier layer material, the barrier layer material may be patterned so as to just cover the surfaces of the interconnect pads 116, and thus form layers 120 as shown in FIG. 3B. Patterning of the barrier layer material can entail using, e.g., photolithography to define the regions where the barrier layer material will remain followed by wet and/or dry etching of the barrier layer material in areas where the barrier layer material is to be removed. Alternatively, a lift-off process can be used, where the barrier layer material is deposited over a layer of patterned photoresist. In regions where the barrier layer material is to be removed, a solvent then is used to effectively "lift-off" the photoresist and barrier layer material coating. In either case, following patterning of the barrier layer material, the chip is exposed to an $O_2$ plasma to remove any remaining photoresist and/or other organic materials that may be on the surfaces of the chip.

Figure 3C:
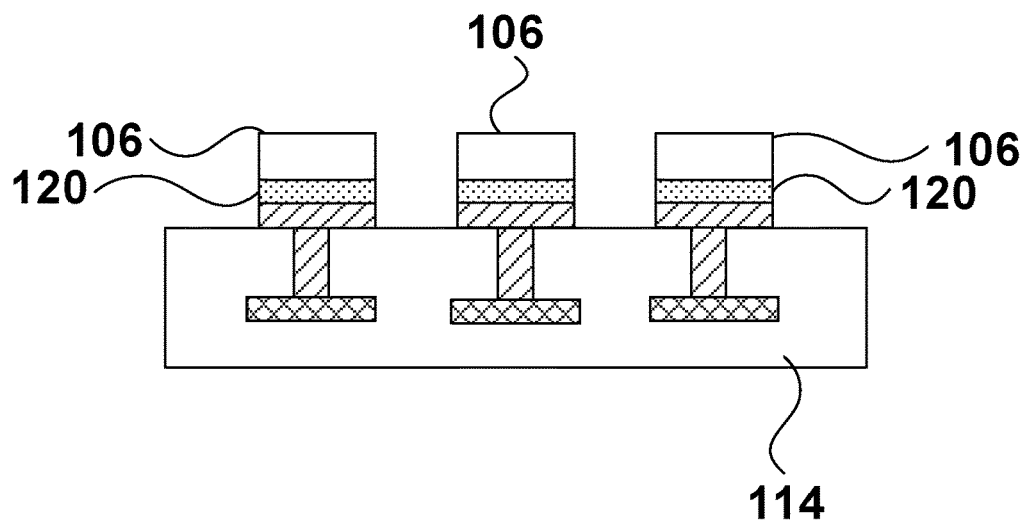

After deposition and patterning of the barrier layer, the exposed surfaces of the barrier layers 120 can be optionally ion milled (208). Milling removes traces of native oxide on the barrier layer to increase conductivity and the reliability of the ensuing superconducting joint. Subsequently, a layer of superconducting material that will form the superconducting bump bonds is deposited on the surface of the barrier layers (210). For instance, the superconducting material that will form the bump bonds can include indium (superconducting critical temperature of about 3.4 K). The superconducting material can be deposited using, e.g., a thermal evaporation deposition process under vacuum (e.g., at about $1*10^{-6}$ Torr). As with the barrier layer 120, the as-deposited superconducting material 106 may be patterned using a combination of photolithography and wet or dry etching techniques to define the bump bond region 106 as shown in FIG. 3C. Alternatively, the superconducting material that will form the bump bonds is patterned using a lift-off process, in which, prior to deposition of the superconductor bump bond material, a photoresist layer is deposited and patterned.

Then, following deposition of the superconductor bump bond material, the resist and undesired superconductor material overlaying the resist are removed using a solvent.

Figure 3D:
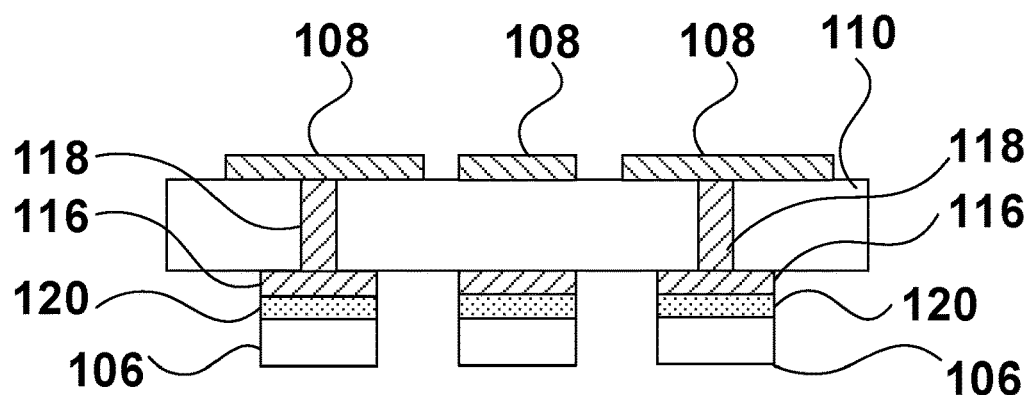
Figure 3D:
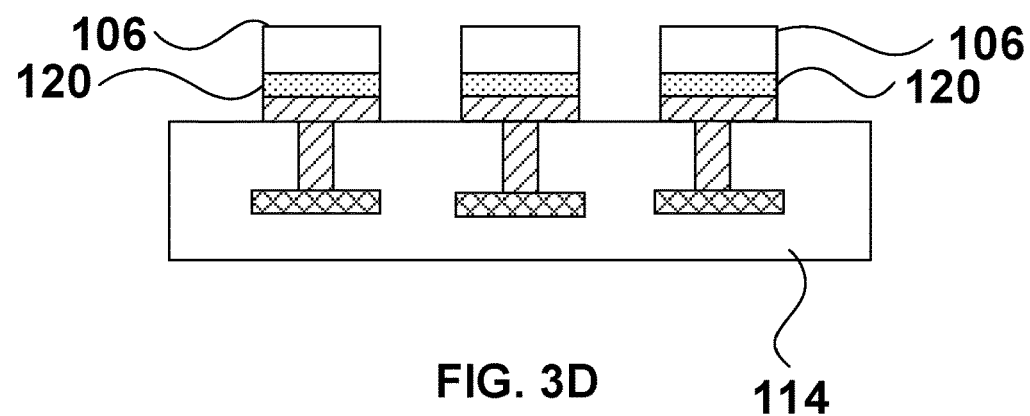

As shown in the example of FIG. 3D, an additional substrate 110 is provided (212). The additional substrate 110 can also include multiple circuit elements 108. As explained herein, the circuit elements 108 can include quantum circuit elements, such as qubits, for example, superconducting co-planar waveguides, quantum LC oscillators, flux qubits, or SQUIDS, among others. The substrate 110 can be formed from a low-loss dielectric material, such as sapphire or single crystalline silicon, and can be in the form of a wafer or a diced chip. One or more of the circuit elements 108 can be electrically connected to one or more interconnect pads 116 through interconnects 118 that are formed within or on the substrate 110. To reduce decoherence, the interconnects 118 and interconnect pads 116 are formed from a superconducting material, such as aluminum.

The same process for preparing the interconnect pads 116 and forming a barrier layer 120, as described above with respect to FIGS. 3B-3C, can also be performed on the additional substrate. For instance, the surfaces of the interconnect pads 116 can be prepared using, e.g., ion-milling, a superconducting diffusion barrier 120 is deposited and patterned on the prepared surfaces of the interconnect pads 116, the exposed surfaces of the barrier layer can be further ion-milled. Additionally, a layer of superconducting material that will form the superconducting bump bonds can be optionally deposited on the surface of the barrier layers. As explained herein, the superconducting material that will form the bump bonds can include, e.g., indium, deposited using a thermal evaporation deposition process and patterned using a combination of photolithography and wet or dry etching techniques or through a lift-off process.

Figure 3E:
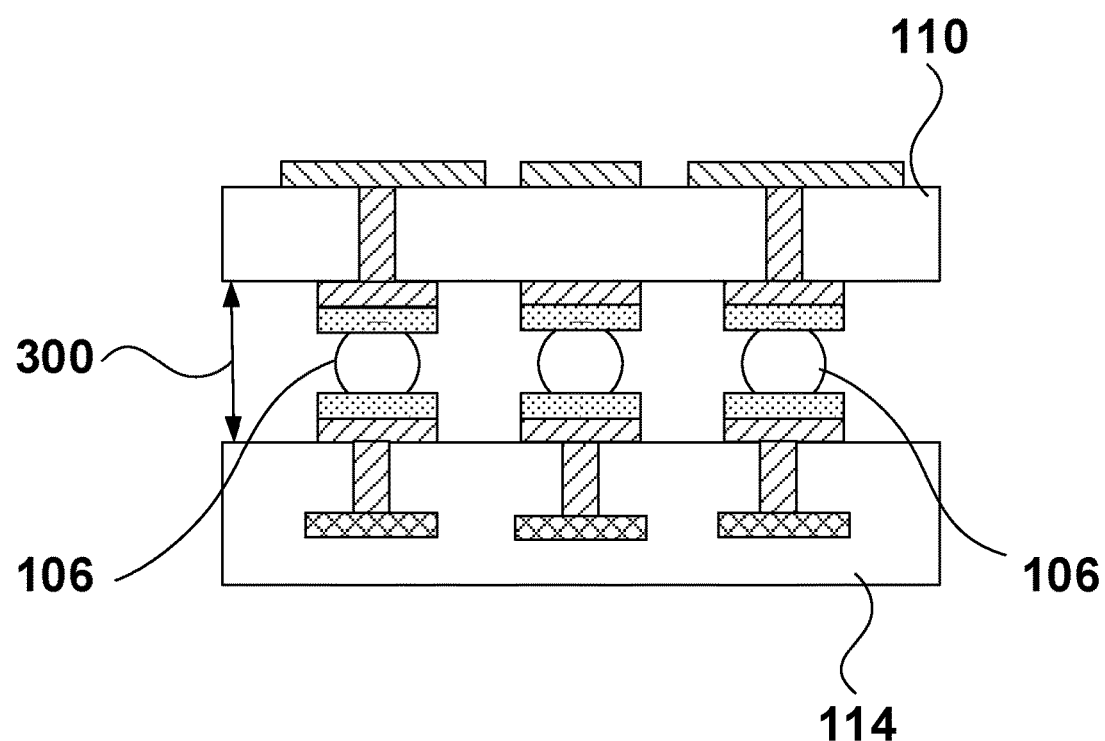

The surfaces of the material that forms the bump bonds 106 on one or both chips then are exposed to an $H_2$ plasma (214). The plasma helps remove oxide from the indium surface, allowing the indium to bond to pure indium, as well as increases the electrical conductivity of an ensuing connection and promotes adhesion. After exposing the superconducting bump bonds 106 to the $H_2$ plasma, the two chips are brought together and joined to one another (216) (e.g., using a bump bonder) as shown in FIG. 3E to produce the stacked device. Pressure bonding can be performed without heat applied (e.g., at room temperature). An example of the pressure used to form the bond is 25 Newtons for 1000 bumps in a 6 mm square chip. An advantage of performing the bonding at room temperature (e.g., in the range of between approximately 18° C. and approximately 30° C.) is that the formation of hillocks and voids at material interfaces can be reduced. Such hillocks and voids can otherwise lead to the formation of two-level systems that interfere with operation of nearby quantum circuit elements, leading to decoherence effects. Performing bonding at room temperature also can reduce material diffusion across interfaces between different materials, which is also associated with giving rise to decoherence in quantum circuit elements. The low temperature/room temperature pressure bonding can be performed using, e.g., the FC 150 available from SETNA, LLC. In some implementations, the wafers are diced into separate chips before the chips are joined.

The thickness of the superconducting bump bonds 106 can be set so that the first chip and second chip are spaced by a desired amount. For example, the distance 300 between a surface of the first chip facing an opposing surface of the second chip can be set to be between approximately 0.5 μm to approximately 100 μm (e.g., between approximately 0.5 μm to approximately 20 μm, between approximately 0.5 μm and approximately 15 μm, between approximately 0.5 μm and approximately 10 μm, between approximately 0.5 μm and approximately 5 μm, or between approximately 0.5 μm and approximately 2.5 μm). For devices, where a first chip containing quantum circuit elements is joined (e.g., bonded) to a second chip containing quantum circuit elements, it is preferable the distance 300 is on the lower end of the foregoing ranges. For example, the distance 300 can be within approximately 0.5 μm to approximately 1 μm. The lower range is desirable because it allows greater electrical coupling, as coupling strengthens with decreasing distance between the chips. In addition, since both chips have low-loss dielectrics, there is less concern about the dielectrics leading to loss and decoherence in quantum circuit elements as the distance between the chips is reduced. In contrast, when a chip containing quantum circuit elements is joined (e.g., bonded) to a chip containing classical circuit elements, the chip having the classical circuit elements may also include lossy materials that induce losses and decoherence in the chip having the quantum circuit elements. Thus, it is desirable in those cases to space the chips apart at a distance 300 that is larger (relative to the distances for the case in which both chips contain quantum circuit elements) to reduce the possibility that the lossy materials will lead to decoherence of the quantum circuit elements. For example, the distance 300 can be within approximately 5 μm to approximately 10 μm. Alternatively, for implementations in which a chip containing quantum circuit elements is joined to a chip containing classical circuit elements, the distance 300 can be, e.g., between approximately 2.5 μm and approximately 15 μm, between approximately 5 μm and approximately 15 μm, or between approximately 7.5 μm and approximately 15 μm. The approximate thickness can be within an uncertainty based on the accuracy and/or precision limitations of the deposition technique(s) used to deposit and/or remove a material as well as of the metrology technique(s) with which the thickness is measured. Though the examples presented herein pertain to a stacked device containing only two chips joined to one another, the principles and techniques can be expanded to chip stacks containing three or more chips. For example, a stacked device can include two chips having quantum circuit elements, in which each chip is joined to the other using superconducting bump bonds as described herein, and in which one of the two chips is also joined through, e.g., superconductor bump bonds as described herein, to a third chip that includes either quantum circuit elements or classical circuit elements.

Embodiments of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the embodiments described above should not be understood as requiring such separation in all embodiments.

Particular embodiments of the subject matter have been described. Other embodiments are within the scope of the following claims.

What is claimed is:

1. A method comprising:
providing a first chip comprising a first circuit element;
forming a first aluminum interconnect pad on a first surface of the first chip so that the first aluminum interconnect pad is electrically connected to the first circuit element;
forming a first titanium nitride barrier layer on the first aluminum interconnect pad;
providing a second chip comprising a second circuit element;
forming an indium bump bond; and
joining the first chip to the second chip with the indium bump bond so that the first circuit element is electrically connected to the second circuit element, wherein joining the first chip to the second chip is performed at room temperature.

2. The method of claim 1, wherein room temperature is between approximately 18° C. and approximately 30° C.

3. The method of claim 2, further comprising removing a native oxide from the first aluminum interconnect pad prior to forming the first titanium nitride barrier layer.

4. The method of claim 3, wherein removing the native oxide comprises ion milling a surface of the first aluminum interconnect pad.

5. The method of claim 2, wherein forming the first titanium nitride barrier comprises reactive sputtering titanium nitride on the first aluminum interconnect pad.

6. The method of claim 2, further comprising ion milling a surface of the first titanium nitride barrier layer prior to joining the first chip to the second chip.

7. The method of claim 2, further comprising exposing a surface of the indium bump bond to a $H_2$ plasma.

8. The method of claim 2, further comprising:
forming a second aluminum interconnect pad on a first surface of the second chip so that the second aluminum interconnect pad is electrically connected to the second circuit element; and
forming a second titanium nitride barrier layer on the second aluminum interconnect pad of the second chip.

9. The method of claim 8, further comprising removing a native oxide from the second aluminum interconnect pad of the second chip prior to forming the second titanium nitride barrier layer.

10. The method of claim 9, wherein removing the native oxide from the second aluminum interconnect pad comprises ion milling a surface of the second aluminum interconnect pad.

11. The method of claim 8, wherein forming the second titanium nitride barrier layer on the second aluminum interconnect pad comprises reactive sputtering titanium nitride on the second aluminum interconnect pad.

12. The method of claim 8, further comprising ion milling a surface of the second titanium nitride barrier layer prior to joining the first chip to the second chip.

13. The method of claim 8, wherein forming the indium bump bond comprises depositing indium on the first titanium nitride barrier, on the second titanium nitride barrier, or on both the first and second titanium nitride barriers.

14. The method of claim 2, wherein the first circuit element comprises a rapid single flux quantum (RSFQ) device and the second circuit element comprises a quantum circuit element.

* * * * *